US009905471B2

(12) United States Patent
Lo et al.

(10) Patent No.: US 9,905,471 B2
(45) Date of Patent: Feb. 27, 2018

(54) INTEGRATED CIRCUIT STRUCTURE AND METHOD FORMING TRENCHES WITH DIFFERENT DEPTHS

(71) Applicant: Taiwan Semiconductor Manufacturing Co., Ltd., Hsin-Chu (TW)

(72) Inventors: Yuan-Yen Lo, Hsin-Chu (TW); Jhih-Yu Wang, New Taipei (TW); Jhun Hua Chen, Changhua County (TW); Hung-Chang Hsieh, Hsin-Chu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 15/434,840

(22) Filed: Feb. 16, 2017

(65) Prior Publication Data
US 2017/0316983 A1    Nov. 2, 2017

Related U.S. Application Data

(60) Provisional application No. 62/329,043, filed on Apr. 28, 2016.

(51) Int. Cl.
*H01L 21/336* (2006.01)
*H01L 21/8234* (2006.01)
*H01L 21/308* (2006.01)
*H01L 29/66* (2006.01)
*H01L 21/306* (2006.01)
*H01L 27/088* (2006.01)
(Continued)

(52) U.S. Cl.
CPC .. *H01L 21/823475* (2013.01); *H01L 21/3085* (2013.01); *H01L 21/30604* (2013.01); *H01L 21/76895* (2013.01); *H01L 21/823468* (2013.01); *H01L 21/823481* (2013.01); *H01L 23/535* (2013.01); *H01L 27/088* (2013.01); *H01L 29/66545* (2013.01); *H01L 29/66553* (2013.01)

(58) Field of Classification Search
None
See application file for complete search history.

(56) References Cited

U.S. PATENT DOCUMENTS 8,448,100 B1    5/2013  Lin et al.
8,631,372 B2    1/2014  Yu et al.
8,669,780 B2    3/2014  Chi
(Continued)

*Primary Examiner* — Jack Chen
(74) *Attorney, Agent, or Firm* — Haynes and Boone, LLP

(57) ABSTRACT

A method includes depositing an ESL on a substrate; patterning the ESL such that a first region of the substrate is covered thereby and a second region of the substrate is exposed within an opening of the etch stop layer; depositing a first dielectric layer on the ESL in the first region and on the substrate in the second region; patterning the first dielectric layer to form a first trench through the first dielectric layer in the first region; forming a metal feature in the first trench; depositing a second dielectric layer over the metal feature in the first region and over the first dielectric layer in the second region; and performing a patterning process to form a second trench through the second dielectric layer in the first region, and to form a third trench through the second and first dielectric layers in the second region.

20 Claims, 18 Drawing Sheets

(51) Int. Cl.
*H01L 23/535* (2006.01)
*H01L 21/768* (2006.01)

(56) References Cited

U.S. PATENT DOCUMENTS

| | | |
|---|---|---|
| 8,701,073 B1 | 4/2014 | Fu et al. |
| 8,754,818 B2 | 6/2014 | Yen et al. |
| 2013/0193981 A1 | 8/2013 | Chen et al. |
| 2013/0246990 A1 | 9/2013 | Yen et al. |
| 2013/0320553 A1 | 12/2013 | Kuo et al. |
| 2014/0043148 A1 | 2/2014 | Wang et al. |
| 2014/0077057 A1 | 3/2014 | Chao et al. |
| 2014/0092939 A1 | 4/2014 | Chang et al. |
| 2014/0126089 A1 | 5/2014 | Chang et al. |
| 2014/0126274 A1 | 5/2014 | Lee et al. |
| 2014/0167799 A1 | 6/2014 | Wang et al. |
| 2014/0195728 A1 | 7/2014 | Hsu et al. |
| 2014/0203397 A1 | 7/2014 | Yen et al. |
| 2014/0211438 A1 | 7/2014 | Lin et al. |
| 2014/0239427 A1 | 8/2014 | Huang et al. |
| 2014/0264772 A1 | 9/2014 | Horng et al. |
| 2014/0266273 A1 | 9/2014 | Wang et al. |
| 2015/0380305 A1* | 12/2015 | Basker .............. H01L 21/76846 257/77 |

\* cited by examiner

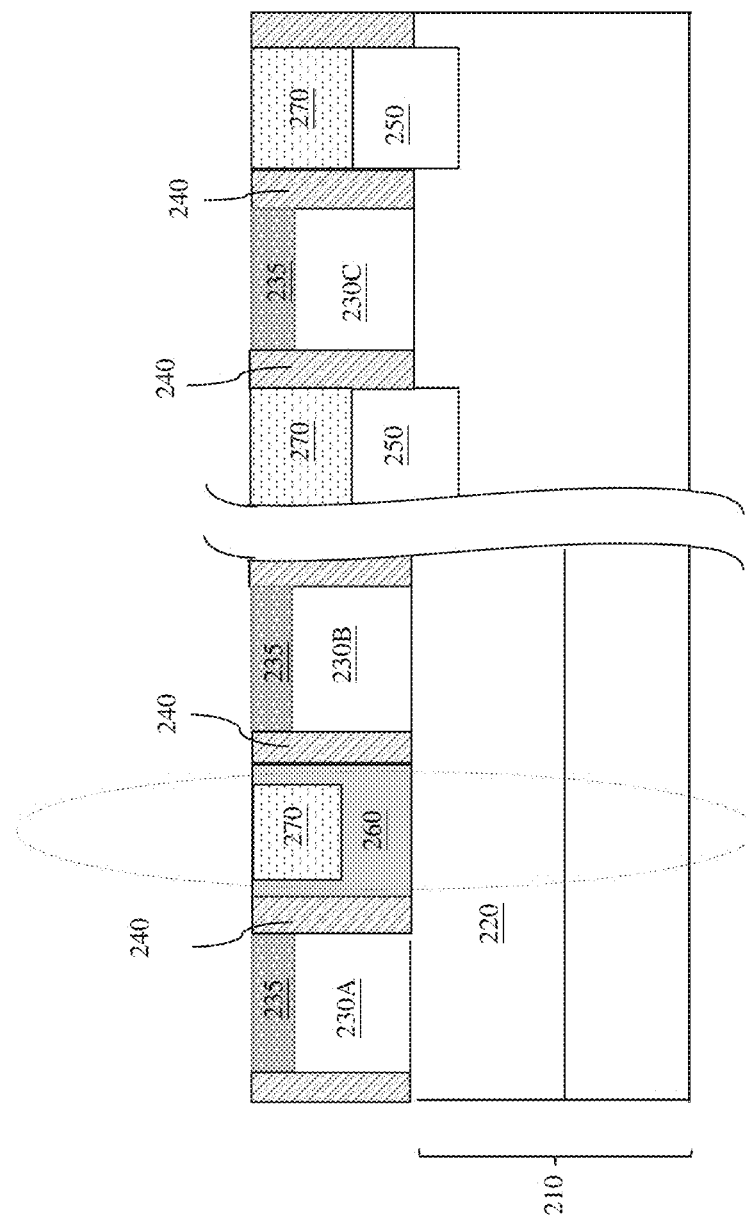

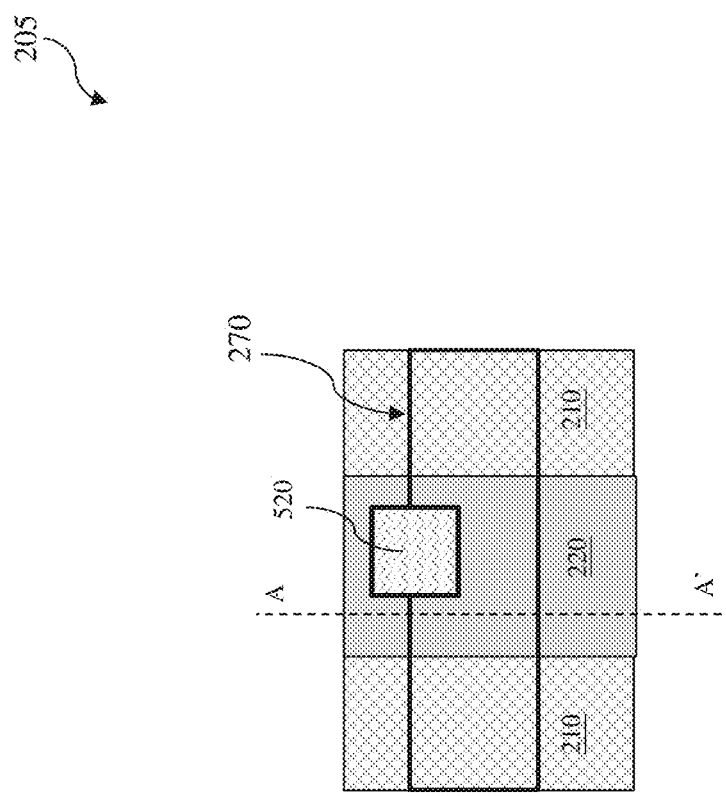

US 9,905,471 B2

INTEGRATED CIRCUIT STRUCTURE AND METHOD FORMING TRENCHES WITH DIFFERENT DEPTHS

PRIORITY DATA

This application claims the benefit of U.S. Provisional Application 62/329,043 entitled "A METHOD OF FORMING TRENCHES WITH DIFFERENT DEPTHS," filed Apr. 28, 2016, herein incorporated by reference in its entirety.

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

In small generations, since device size is getting smaller and transistor density is getting higher, the interconnection of metal to metal gate (MG), and metal to active area (MD) by a via becomes more critical. Improvement is desired in this area.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

FIG. 2 is a cross-sectional view of an example initial structure in accordance with some embodiments.

FIG. 7A is a top view of FIG. 7, in portion, constructed in accordance with some embodiments.

DETAILED DESCRIPTION

Figure 1:
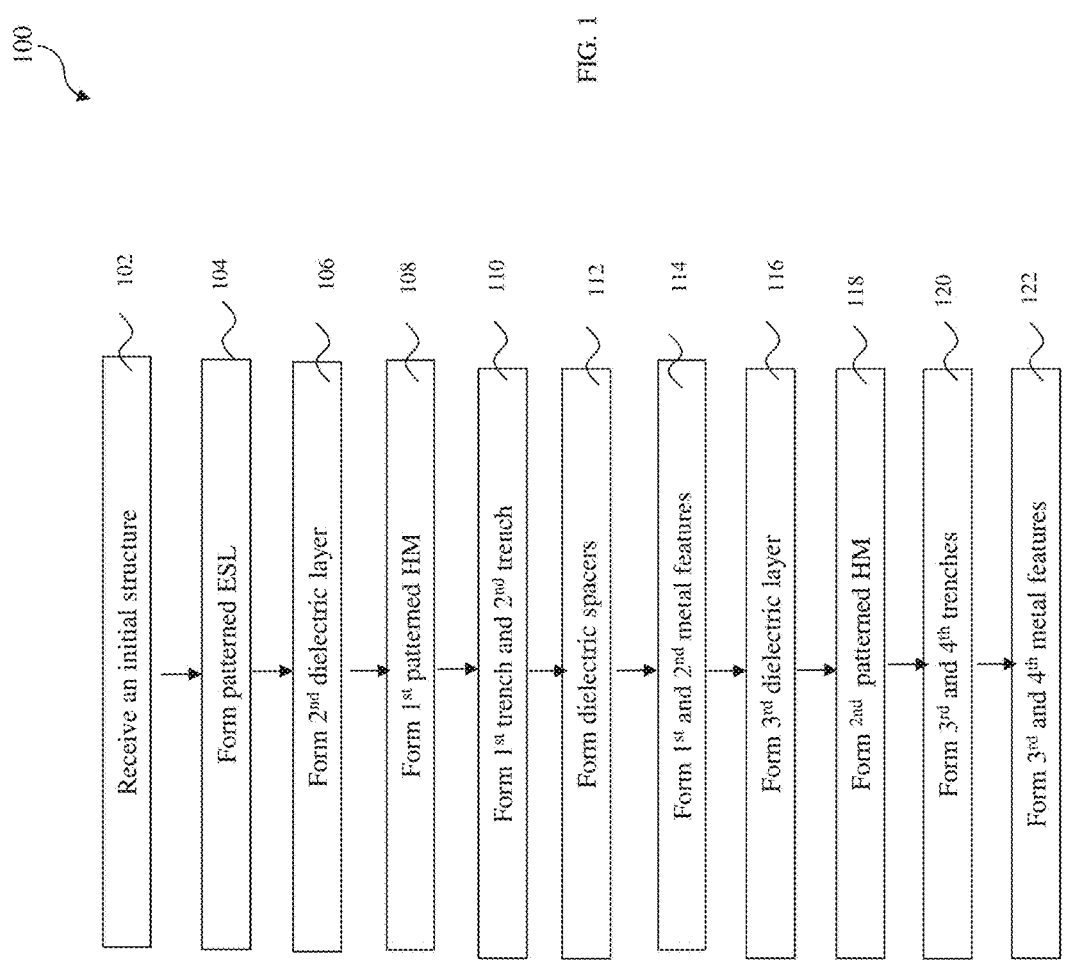
FIG. 1 is a flowchart of an example method for fabricating a semiconductor device constructed in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more semiconductor device in accordance with some embodiments. The method 100 is an example, and is not intended to limit the present disclosure beyond what is explicitly recited in the claims. Additional operations can be provided before, during, and after the method 100, and some operations described can be replaced, eliminated, or relocated for additional embodiments of the method. The method 100 is discussed in detail below, with reference to an initial structure 205 of a semiconductor device 200 showed in FIG. 2 and the semiconductor device 200 shown in FIGS. 3 through 11B.

As will be shown, the device 200 is a planar FET device. This does not necessarily limit the embodiments to any types of devices, any number of devices, any number of regions, or any configuration of structures or regions. For example, the provided subject matter can be applied in fabricating FinFET devices and other type of multi-gate FET devices. Furthermore, the device 200 may be an intermediate device fabricated during the processing of an IC, or a portion thereof, that may comprise static random access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

Referring to FIGS. 1 and 2, method 100 begins at block 102 by receiving the initial structure 205 of the semiconductor device 200. The initial structure 205 includes a substrate 210. The substrate 210 may be a bulk silicon substrate. Alternatively, the substrate 210 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrate 210 also includes a silicon-on-insulator (SOI) substrate, such as fabricated using separation by implantation of oxygen (SIMOX), buried oxide layer (BOX), wafer bonding, and/or other suitable methods.

The substrate 210 also includes various doped regions. The doped regions may be doped with p-type dopants, such as boron or $BF_2$; n-type dopants, such as phosphorus or arsenic; or combinations thereof. The doped regions may be formed directly on the substrate 210, in a P-well structure, in an N-well structure, in a dual-well structure, or using a raised structure.

The substrate 210 may also include various isolation features 220, thereby defining various active regions and separating various devices in the substrate 210. The isolation features 220 include different structures formed by using different processing technologies. For example, the isolation features 220 may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features 220. In the present embodiment, the left portion and right portion are different portions of the substrate but not necessary contact each other, as therefore illustrated in FIGS. 2 and 3. In the following figures, those portions are shown as contacting each other for simplicity.

The initial structure 205 also includes a plurality of first conductive features, 230A, 230B and 230C, over the substrate 210. In the present embodiment, the first conductive features, 230A, 230B and 230C, may be gate structures including high-k/metal gate stacks (HK/MGs). Alternatively, in some embodiment, the first conductive features, 230A, 230B and 230C, may also include a portion of the interconnect structure, such as a contact, a metal via, and/or metal line. In various embodiments, the first conductive features 230A, 230B and 230C include electrodes, capacitors, resistors or a combination thereof. For the purpose of simplicity and clarity, the first conductive features 230A, 230B and 230C are referred to as the HK/MGs, 230A, 230B and 230C, according to the present embodiment.

In some embodiments, the HK/MGs 230A, 230B and 230C include interfacial layers, gate dielectric layers, work function metal layers and fill layers. In some other embodiments, the interfacial layers include a dielectric material such as silicon oxide or silicon oxynitride, and may be formed by chemical oxidation, thermal oxidation, ALD, CVD, and/or other suitable dielectric. The gate dielectric layer may include a high-k dielectric layer such as hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof. The gate dielectric layers may be formed by ALD and/or other suitable methods. The work function metal layers may be an n-type work function layer for NFETs or a p-type work function layer for PFETs, and may be deposited by CVD, PVD, and/or other suitable process. The p-type work function layer comprises a metal with a sufficiently large effective work function, selected from but not limited to the group of titanium nitride (TiN), tantalum nitride (TaN), ruthenium (Ru), molybdenum (Mo), tungsten (W), platinum (Pt), or combinations thereof. The n-type work function layer comprises a metal with sufficiently low effective work function, selected from but not limited to the group of titanium (Ti), aluminum (Al), tantalum carbide (TaC), tantalum carbide nitride (TaCN), tantalum silicon nitride (TaSiN), or combinations thereof. The fill layers may include aluminum (Al), tungsten (W), or copper (Cu) and/or other suitable materials, and may be formed by CVD, PVD, plating, and/or other suitable processes. A CMP process may be performed to remove excess materials from the HK/MG stacks, 230A, 230B and 230C, and to planarize a top surface of the initial structure 205.

In some alternative embodiments, dummy gate stacks are formed first and then are replaced later by HK/MGs 230A, 230B and 230C, after high thermal temperature processes are performed, such as thermal processes during sources/drains formation. The dummy gate stacks may include a dummy gate dielectric layer and a polysilicon layer and may be formed by deposition, lithography patterning and etching processes.

In some embodiments, a gate hard mask (GHM) 235 is formed on top of each of the HK/MGs 230A, 230B and 230C and is used as an etch mask during the formation of the HK/MGs. In some embodiments, the GHM 235 includes silicon nitride. In some embodiments, the GHM 235 may include titanium (Ti), titanium oxide, TiN, TiSiN, tantalum (Ta), tantalum oxide, TaN, TaSiN, silicon nitride, silicon oxide, silicon carbide, silicon carbide nitride, manganese (Mn), cobalt (Co), ruthenium (Ru), WN, aluminum nitride, aluminum oxide, and/or other suitable material. The GHM 235 may be formed by deposition, lithography patterning and etch processes.

In some embodiments, gate spacers 240 may be formed along the sidewalls of the HK/MGs 230A, 230B and 230C. In some embodiments, the gate spacers 240 include a dielectric material, such as silicon nitride. Alternatively, the gate spacers 240 may include silicon carbide, silicon oxynitride, and/or other suitable material. The gate spacers 240 may be formed by depositing a gate spacer layer and then anisotropic dry etching the gate spacer layer.

The initial structure 205 may also include second conductive features 250 over the substrate 210. A top surface of the second conductive feature 250 may not be at same horizontal level as the HK/MG stacks 230A, 230B and 230C. In one example, the top surface of the second conductive feature 250 is below the top surface of the HK/MG stacks 230A, 230B and 230C. The second conductive feature 250 may be formed by processes such as deposition, lithography patterning and etching. In some embodiments, the second conductive features 250 are source/drain (S/D) features, disposed beside and separated by the HK/MG 230A and formed by selective epitaxy growth or ion implantation. Alternatively, in some embodiments, the second conductive feature 250 may also include a portion of the interconnect structure, such as a contact, metal via, or metal line. For example, the second conductive features 250 include electrodes, capacitors, resistors or a portion of a resistor. For the purpose of simplicity and clarity, the second conductive feature 250 is referred to as the S/D feature 250 hereinafter.

Here, one of the S/D features 250 is a source feature and another of the S/D features 250 is a drain feature. In one embodiment, a portion of the substrate 210, beside the HK/MG 230A is recessed to form S/D recesses and then the S/D features 250 are formed over the S/D recesses by one or more selective epitaxial growing process, such CVD deposition techniques (e.g., vapor-phase epitaxy (VPE) and/or ultra-high vacuum CVD (UHV-CVD)), molecular beam epitaxy, and/or other suitable processes. In various examples, the S/D features 250 include germanium (Ge), silicon (Si), gallium arsenide (GaAs), aluminum gallium arsenide (AlGaAs), silicon germanium (SiGe), gallium arsenide phosphide (GaAsP), gallium antimony (GaSb), indium antimony (InSb), indium gallium arsenide (InGaAs), indium arsenide (InAs), other suitable materials, or a combination thereof. The S/D features 250 may be in-situ doped during the selective epitaxial growing process. Alternatively, when the S/D feature 250 is not in-situ doped, an implantation process (i.e., a junction implant process) is performed to dope the S/D feature 250. One or more annealing processes may be performed to activate dopants.

In the present embodiment, the initial structure 205 includes a first dielectric layer 260 deposited over the substrate 210, including filling in spaces between the HK/MGs 230B and 230C. The first dielectric layer 260 may include tetraethylorthosilicate (TEOS) oxide, fluorinated silica glass (FSG), un-doped silicate glass, or doped silicon oxide such as borophosphosilicate glass (BPSG), phosphosilicate glass (PSG), boron doped silicon glass (BSG), and/or other suitable dielectric materials. The first dielectric layer 260 may also include a dielectric material having a dielectric constant (k) lower than thermal silicon oxide (therefore referred to as low-k dielectric material layer). The low-k dielectric material may include carbon containing materials, organo-silicate (OSG) glass, porous dielectric materials, a hydrogen silsesquioxane (HSQ) dielectric material, a methylsilsesquioxane (MSQ) dielectric material, a carbon doped oxide (CDO) dielectric material, a hydrogenated silicon oxy-carbide (SiCOH) dielectric material, a benzocyclobutene (BCB) dielectric material, an arylcyclobutene based dielectric material, a polyphenylene based dielectric material, other suitable materials, and/or a combination thereof. The first dielectric layer 260 may include a single layer or multiple layers. The first dielectric layer 260 may be deposited by CVD, ALD, spin-on coating, and/or other suitable techniques, and may further be followed by a chemical mechanic polishing (CMP) process to polish and planarize the top surface.

Figure 2A:
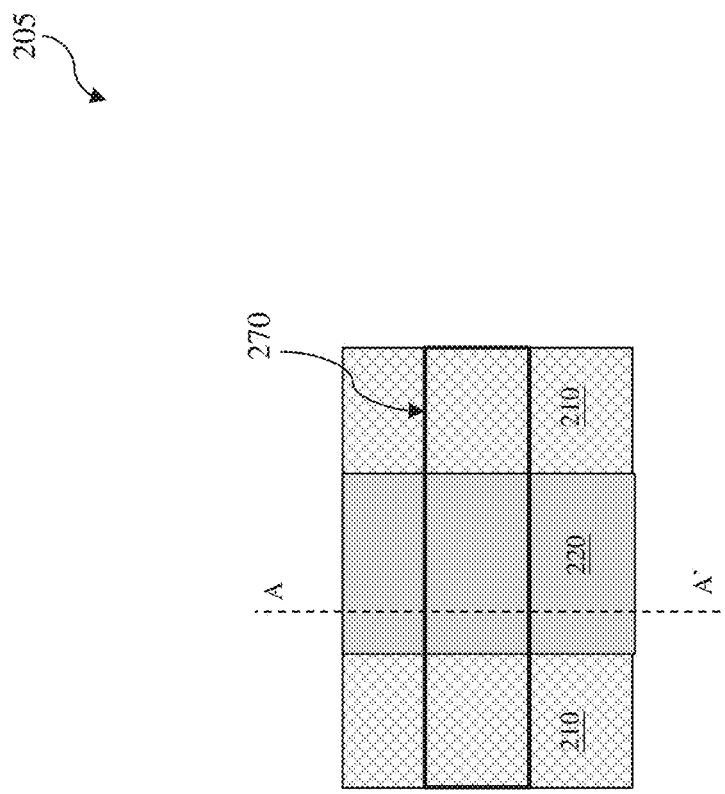
FIG. 2A is a top view of FIG. 2, in portion, constructed in accordance with some embodiments.

The initial structure 205 may also include third conductive features 270 over respective S/D features 250. In the present embodiment, the third conductive features 270 are S/D contact metals. As shown, the S/D contact metals 270 extend to and electrically connected to the respective S/D features 250. The S/D contact metal 270 may include copper (Cu), aluminum (Al), tungsten (W), copper, copper magnesium (CuMn), copper aluminum (CuAl) or copper silicon (CuSi), and/or other suitable conductive material. The formation of the S/D contact metals 270 may include forming trenches and filling the trenches with a metal layer; and performing a CMP process to planarize the top surface and remove the excessive metal layer. In some embodiments, the S/D contact metals 270 have elongated shapes for better contact and electric routing. For example, one of the S/D metal contacts 270 on the left of FIG. 2 may land on two S/D features on different active regions separated by the isolation feature 220. This may be further illustrated in FIG. 2A as a top view of the structure 205, in portion (in the dashed circle), according to some embodiments. FIG. 2A only shows the substrate 210, the isolation feature 220, and the contact metal 270 in portion. Those features in FIG. 2 are sectional view of FIG. 2A along the dashed line AA'. In FIG. 2A, two active regions 210 (such as fin active regions) are defined and separated by the isolation feature 220. The contact metal 270 has an elongated shape, extends over the isolation feature 220, and lands on both active regions 210 (such as lands on respective S/D features in both active regions).

Typically, one or more film layers may be formed over the initial structure 205 and then trenches are formed to reach respective features located at different horizontal levels (depths) of the film layers, in order to form various conductive routings. In the present embodiment, various conductive features are further formed over to connect to respective gates and source/drain features. To achieve fabrication simplicity, cost reduction and fabrication freedom, it is desired to form conductive features landing on respective and gates and source/drain features in a same etching process. The forming of those conductive features includes form respective trenches by the same etching process is challenging, especially considering that over-etching is needed due to those trenches having different depths; and etching through the hard mask 235 of the gate stack 235 may damage the gate spacers 240, leading to short or bridging issues. The present disclosure provides a structure and a method making the structure to achieve the above without short/bridging issues, therefore accomplishing fabrication freedom and efficiency.

Figure 3:
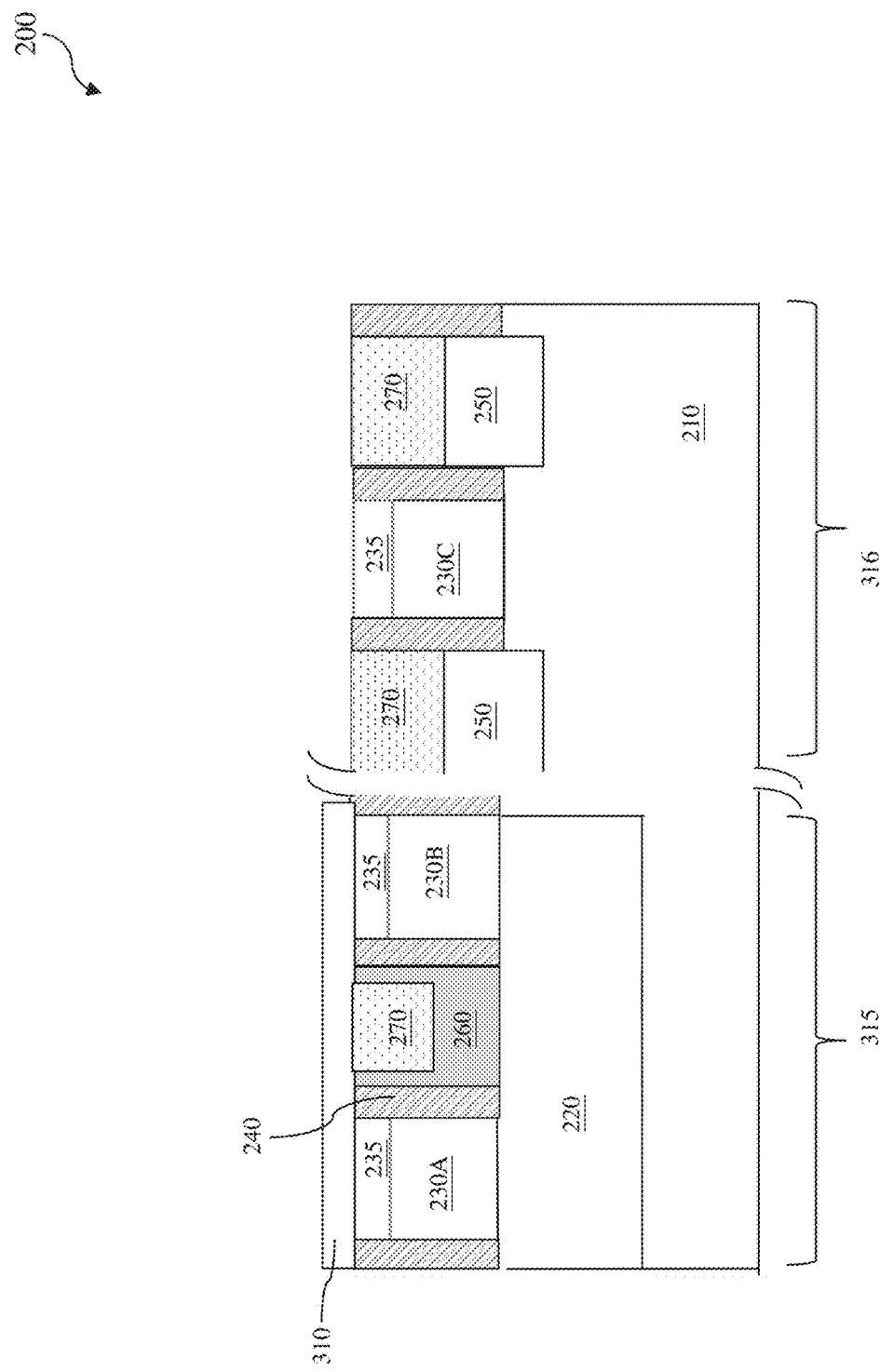
FIGS. 3, 4, 5A, 5B, 6A, 6B, 7, 8, 9A, 9B, 10A, 10B, 11A and 11B are cross-sectional views of an example semiconductor device in accordance with some embodiments.

Referring to FIGS. 1 and 3, with received initial structure 205, method 100 proceeds to operation 104 by forming a patterned etch-stop-layer (ESL) 310 over substrate 210. In the present embodiment, the patterned ESL 310 covers a first region 315 (shallower trenches are to be formed in a dielectric layer) and leaves a second region 316 uncovered (where deeper trenches are to be formed in the dielectric layer). In the present embodiment, the isolation feature 220 extends within the first region 315 while the active region extends within the second region 316, as illustrated in FIG. 3. In an embodiment, the first region 315 includes HK/MG stacks 230A and 230B and the first dielectric layer 260 and the second region 316 includes the HK/MG stack 230C and the S/D contact metals 270. The patterned ESL 310 is formed by deposition and lithography patterning. The patterned ESL 310 is designed with composition different from other dielectric materials, especially different from the gate hard mask 235. Therefore, the subsequent etch process to open the gate hard mask 235 will not break the patterned ESL 310, accordingly protecting the structure underlying the patterned ESL 310 from being damaged. In some embodiments, the patterned ESL 310 includes dielectric materials, such as silicon oxide, silicon carbide, and/or other suitable material. The patterned ESL 310 may also include multiple film layers, such as silicon oxide and silicon nitride. The patterned ESL 310 may be formed by a procedure including deposition, lithography patterning and etch.

Figure 4:
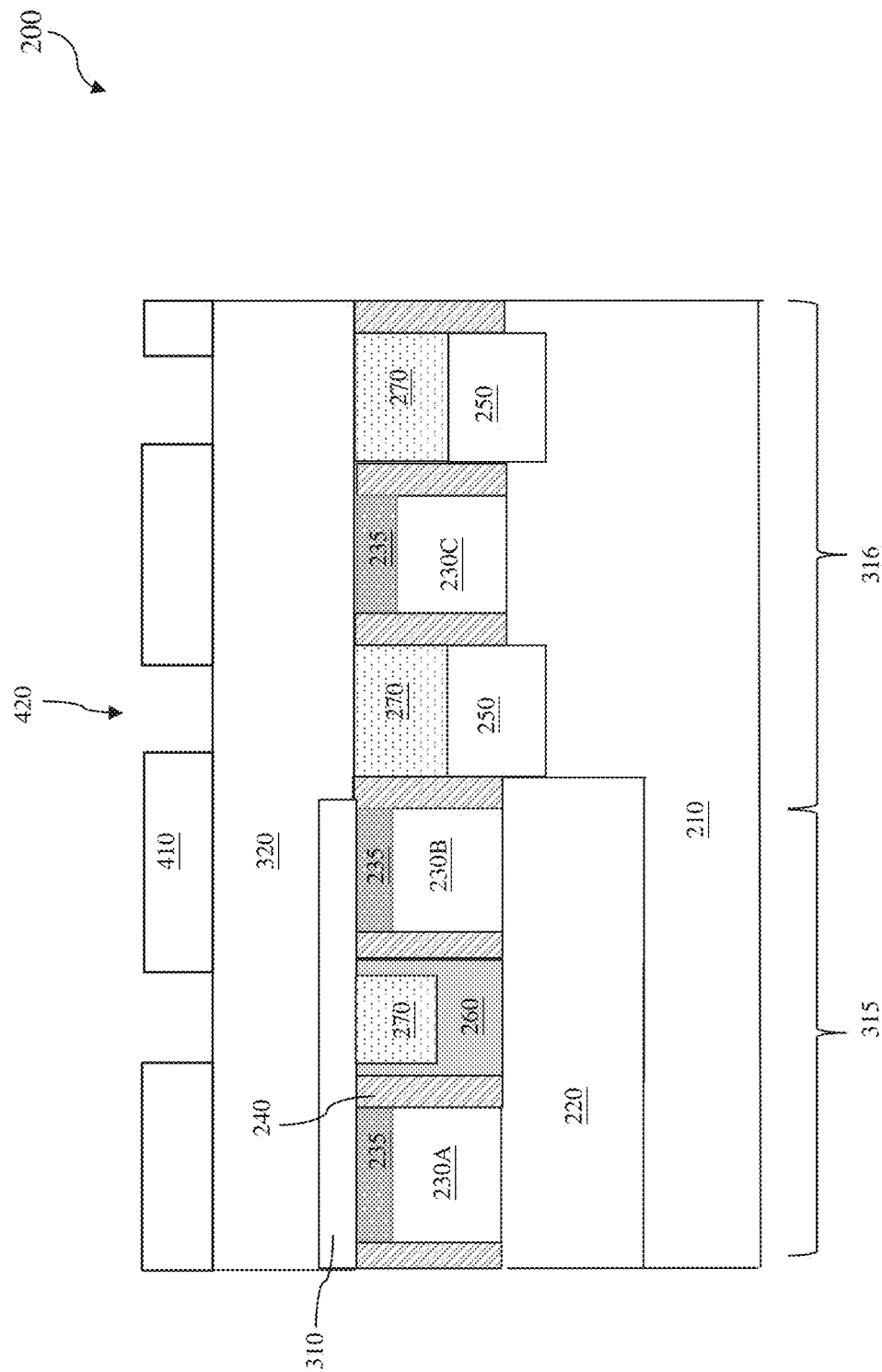

Referring to FIGS. 1 and 4, method 100 proceeds to operation 106 by forming a second dielectric layer 320 over the first and second region, 315 and 316, including over the patterned ESL 310. The second dielectric layer 320 is formed similarly in many respects to the first dielectric layer 260 discussed above in association with FIG. 2, including the materials discussed therein.

Still referring to FIGS. 1 and 4, method 100 proceeds to operation 108 by forming a first patterned HM 410 having a plurality of first openings 420 over the second dielectric layer 320. The first openings 420 define regions where trenches are subsequently formed therethrough. In the present embodiment, the first openings 420 align to respective conductive features, such as contact metals 270 or gate stacks 230.

In some embodiments, the first patterned HM 410 is a patterned photoresist layer and formed by a by a lithography process. An exemplary lithography process may include forming a photoresist layer, exposing the photoresist layer by a lithography exposure process, performing a post-exposure bake process, and developing the photoresist layer to form the patterned resist layer. Alternatively, the first patterned HM 410 may be formed by depositing a HM layer, forming a patterned photoresist layer over the HM layer by a lithography process and etching the HM material layer through the patterned photoresist layer to form the first patterned HM 410.

Figure 5A:
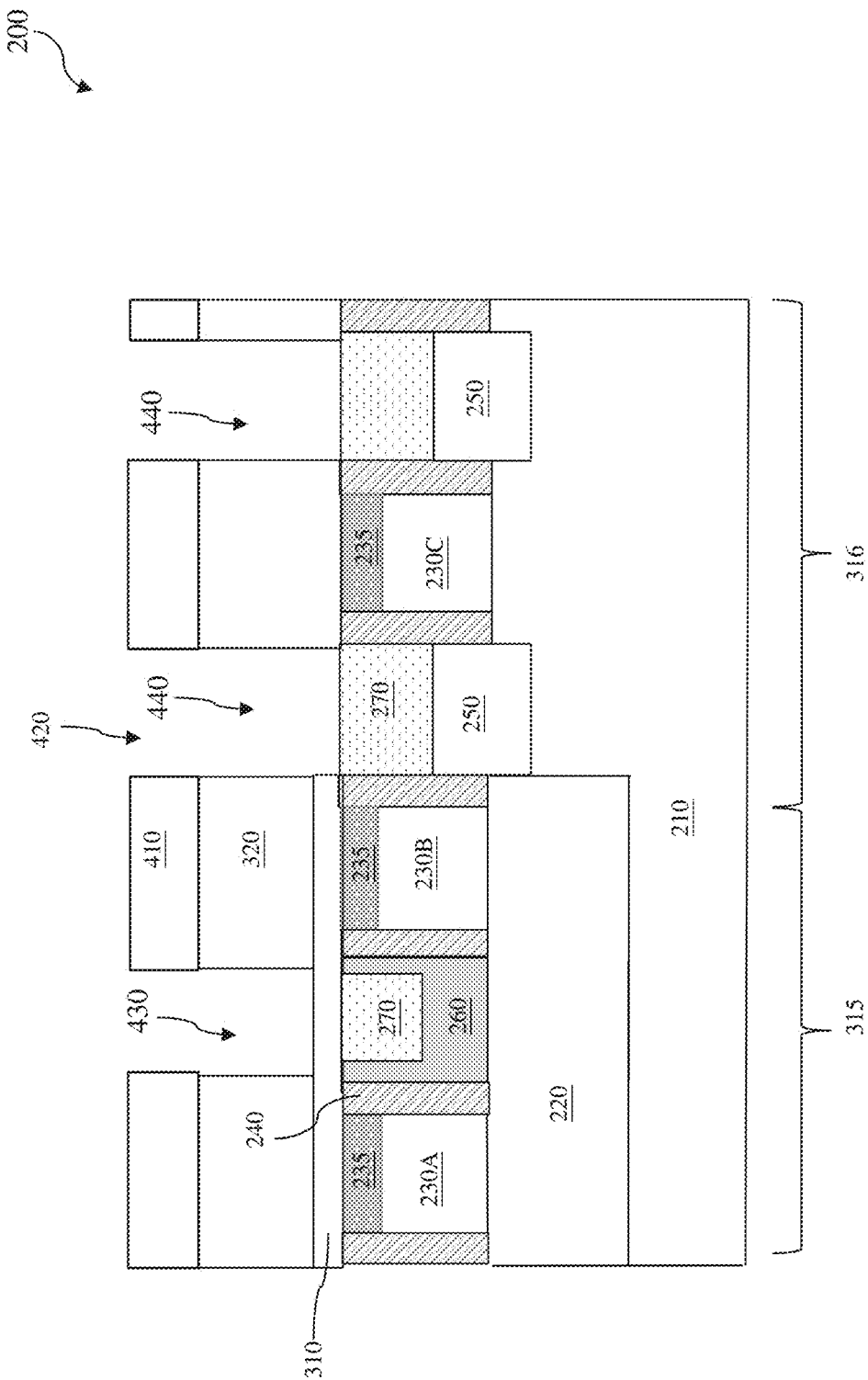

Referring to FIGS. 1 and 5A, method 100 proceeds to operation 110 by etching the second dielectric layer 320 through the first openings 420 to form first trenches 430 in the first region 315 and second trenches 440 in the second region 316. The first trenches 430 are aligned over a conductive feature, such as the contact metal 270 in the first dielectric layer 260. The second trenches 440 are aligned with the S/D contact metals 270 in the second region 316. In an embodiment, each of the first and second trenches, 430 and 440, are formed with a vertical profile (i.e. straight wall profile). In another embodiment, each of the first and second trenches, 430 and 440, are formed with taper profile. In some embodiments, a portion of the patterned ESL 310 is exposed in the respective first trenches 430 and a portion of the S/D contact features 270 are exposed in the respective second trench 440. The trench etch may include a wet etch, a dry etch, and/or a combination thereof. As an example, the trench etch includes a plasma dry etching process using a fluorine-based chemistry, such as $CF_4$, $SF_6$, $CH_2F_2$, $CHF_3$, and/or $C_2F_6$. As another example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); and/or other suitable wet etchant.

Figure 5B:
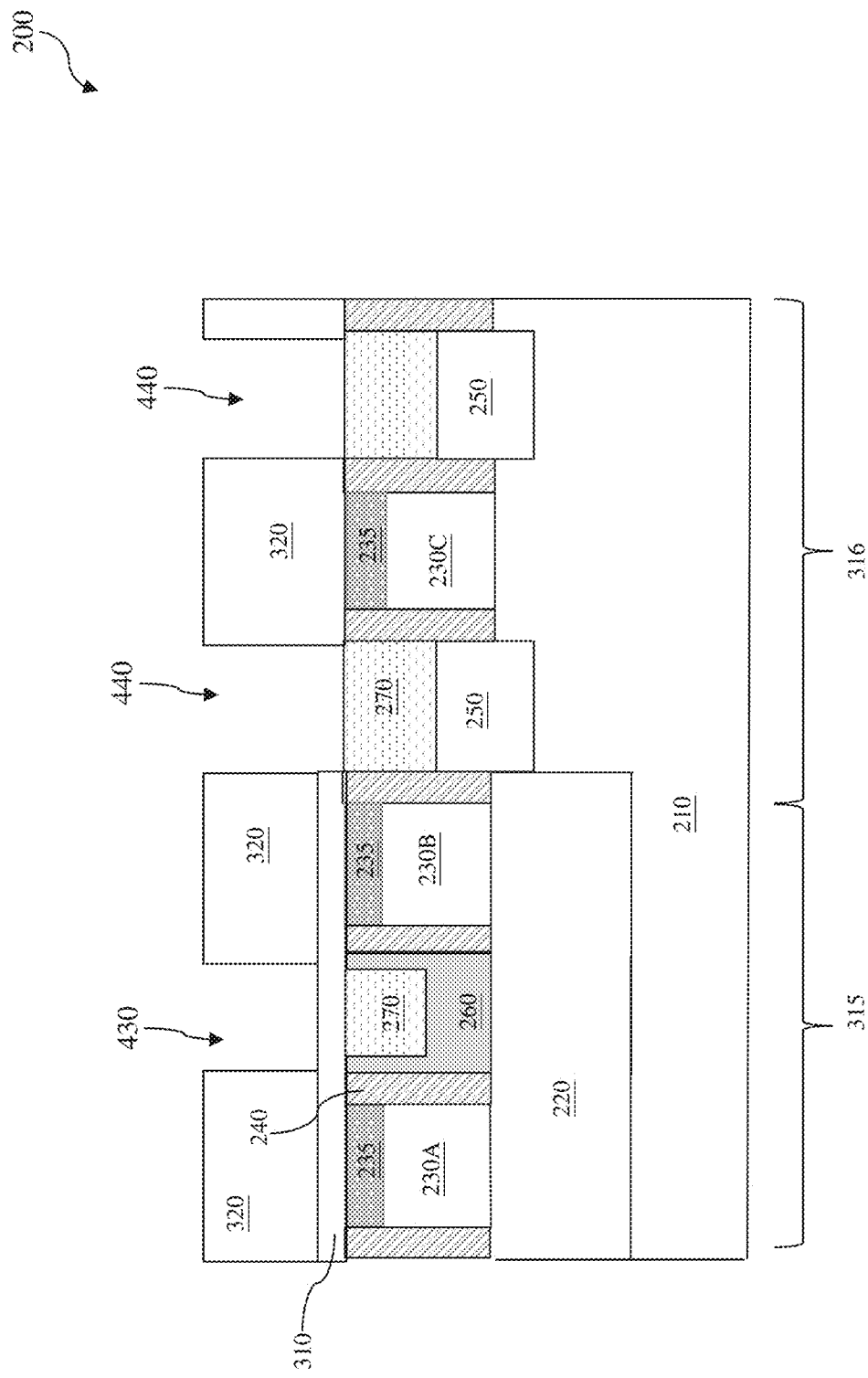

After forming the first and second trenches (430 and 440), the first patterned HM 410 may be removed by another etch process, as shown in FIG. 5B. In one example where the first patterned HM 410 is a photoresist pattern, the first patterned HM 410 is removed by wet stripping and/or plasma ashing.

Figure 6A:
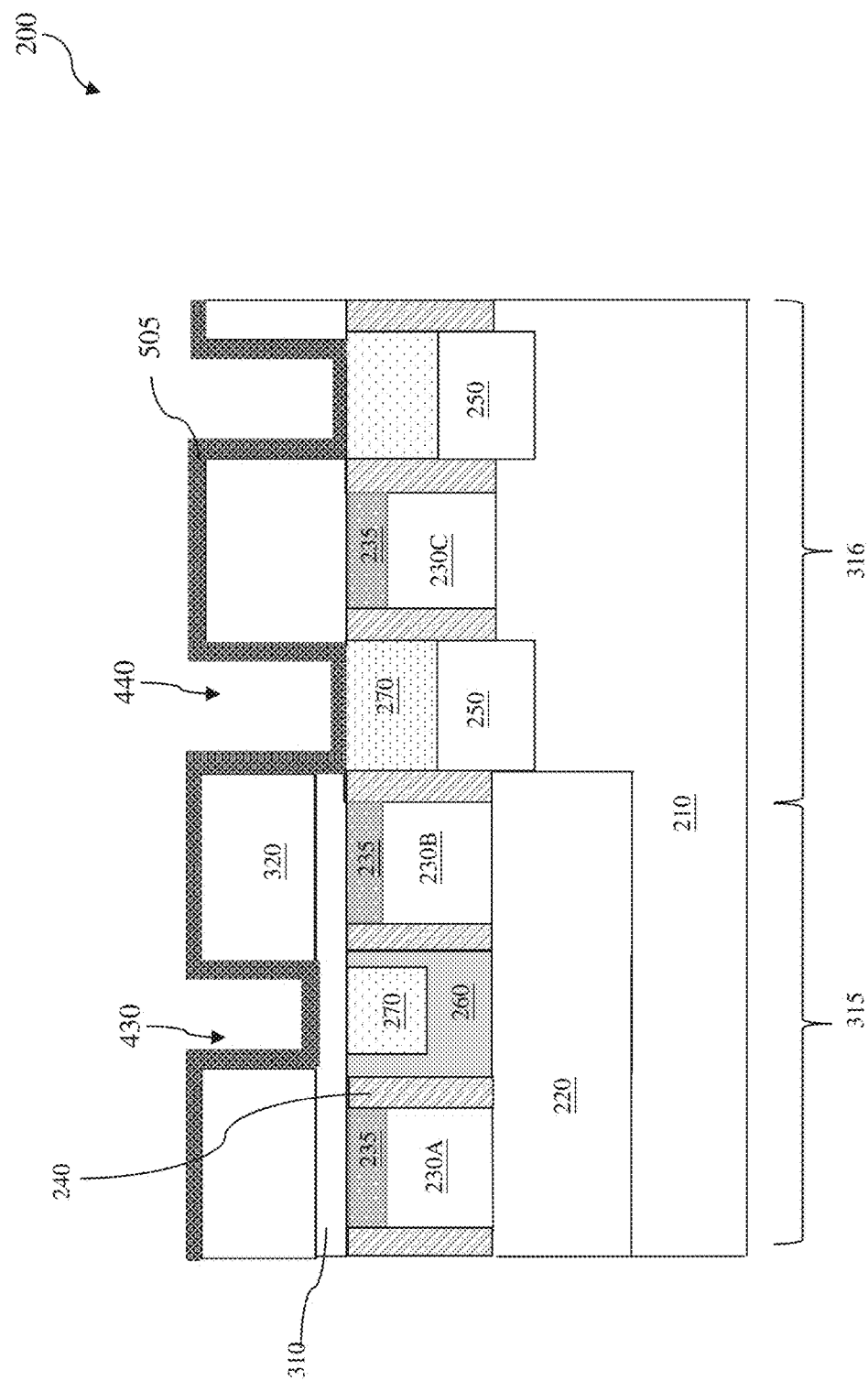
Figure 6B:
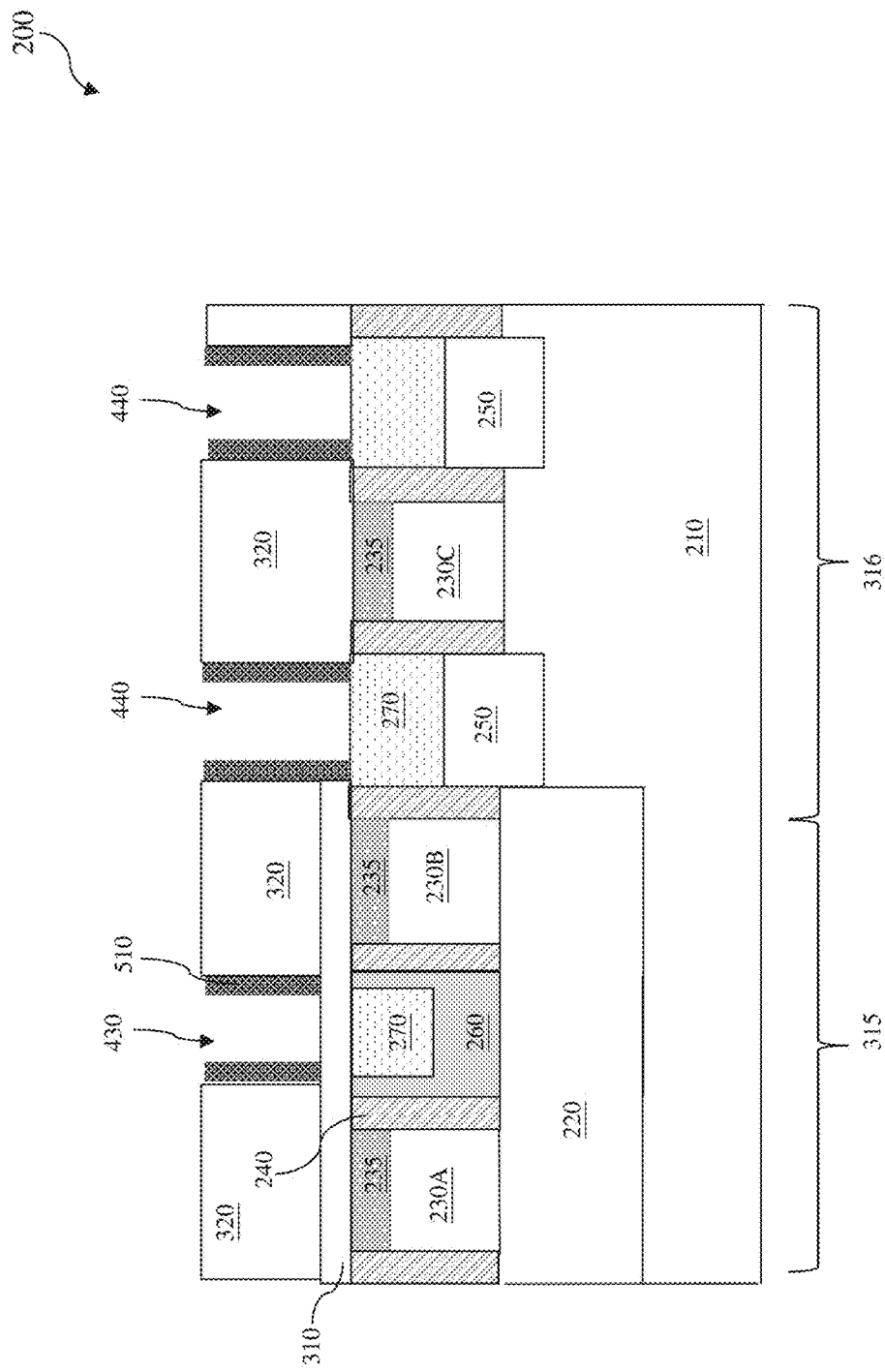

Referring to FIGS. 1, 6A and 6B, method 100 proceeds to operation 112 by forming dielectric spacers 510 on sidewalls of the first and second trenches, 430 and 440. In some embodiment, the dielectric spacers 510 are formed by depositing a dielectric material layer 505 on sidewalls of the first and second trenches, 430 and 440, as shown in FIG. 6A and then anisotropically etching the dielectric material layer 505. In some examples, the deposition may include CVD, ALD, and/or other suitable methods. In some examples, the anisotropic etch may include a dry etch, such as a plasma etch with a bias and a suitable etchant, such as $CF_4$, $SF_6$, $NF_3$, $CH_2F_2$, and/or a combination thereof. During the etching process, the dielectric material layer at the bottom of the first and second trenches 430 and 440 are removed as well. As a result, a portion of the patterned ESL 310 is exposed within the first trenches 430 and portions of the S/D contact metal 270 are exposed within second trenches 440.

The dielectric material layer 505 is different from the patterned ESL 310 in composition to achieve etching selectivity in subsequent etches. In some embodiments, the dielectric material layer 505 may include silicon oxide, silicon nitride, silicon oxynitride, silicon carbon nitride, and/or a combination thereof. The dielectric material layer 505 may include multiple films, such as a silicon oxide film and a silicon nitride film.

Figure 7:
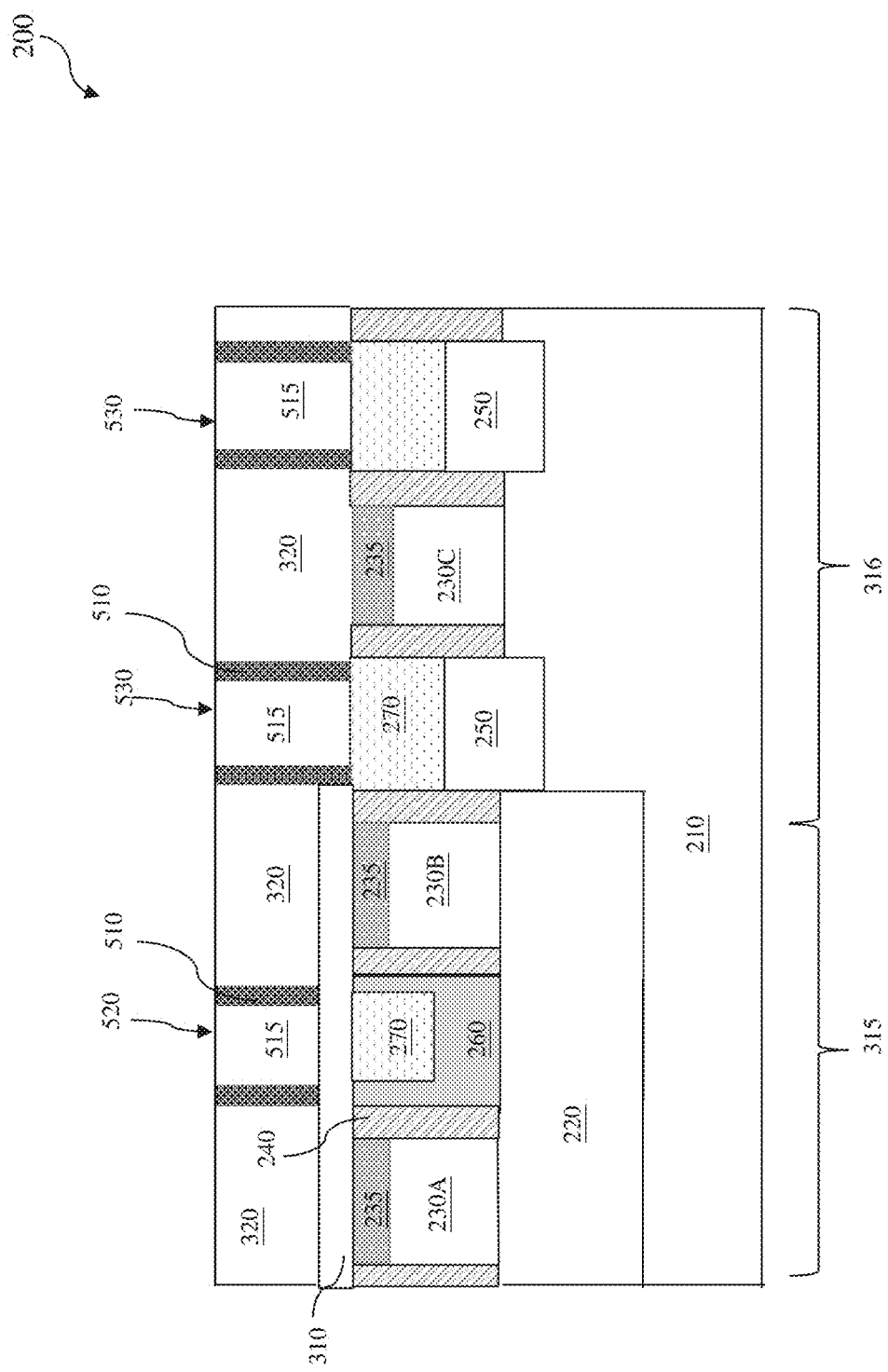

Referring to FIGS. 1 and 7, method 100 proceeds to operation 114 by depositing a first metal layer 515 in the first and second trenches 430 and 440. In some embodiments, prior to depositing the first metal layer 515, a glue layer (or adhesive layer) is deposited in the first and second trenches 430 and 440 to enhance material adhesion. The glue layer may include titanium nitride (TiN), tantalum nitride (TaN), tungsten nitride (WN), titanium silicon nitride (TiSiN) or tantalum silicon nitride (TaSiN). The first metal layer 515 may include copper (Cu), aluminum (Al), tungsten (W), copper, copper magnesium (CuMn), copper aluminum (CuAl) or copper silicon (CuSi), or other suitable conductive material. In an embodiment, the first metal layer 510 includes W. The glue layer and the first metal layer 515 may be deposited by PVD, CVD, metal-organic chemical vapor deposition (MOCVD), or plating. In some embodiments, a CMP process is performed to remove excessive first metal layer 515. The remaining first metal layer 515 in the first and second trenches 430 and 440 forms first and second metal features 520 and 530, respectively. As a result, the first metal feature 520 contacts with the patterned ESL 310 within the first trench 430 and the second metal features 530 contact with S/D contact metals 270 within the second trenches 440. Both of the first and second metal features 520 and 530 have dielectric spacers 510 along the respective sidewalls.

In the present embodiment, dielectric spacers 510 enhance electric insulation between respective first and second metal features (520 and 530) and the HK/MG stacks (230A, 230B and 230C). In some embodiments, the first and second metal features 520 and 530 are designed to couple with respective conductive features and to provide vertical and horizontal electrical routing. For example, the first metal feature 520 is electrically connected to the contact metal 270 (as illustrated in FIG. 7A in a top view) while the second metal features 530 electrically connect with the S/D feature 250 through the S/D contact metal 270.

Figure 8:
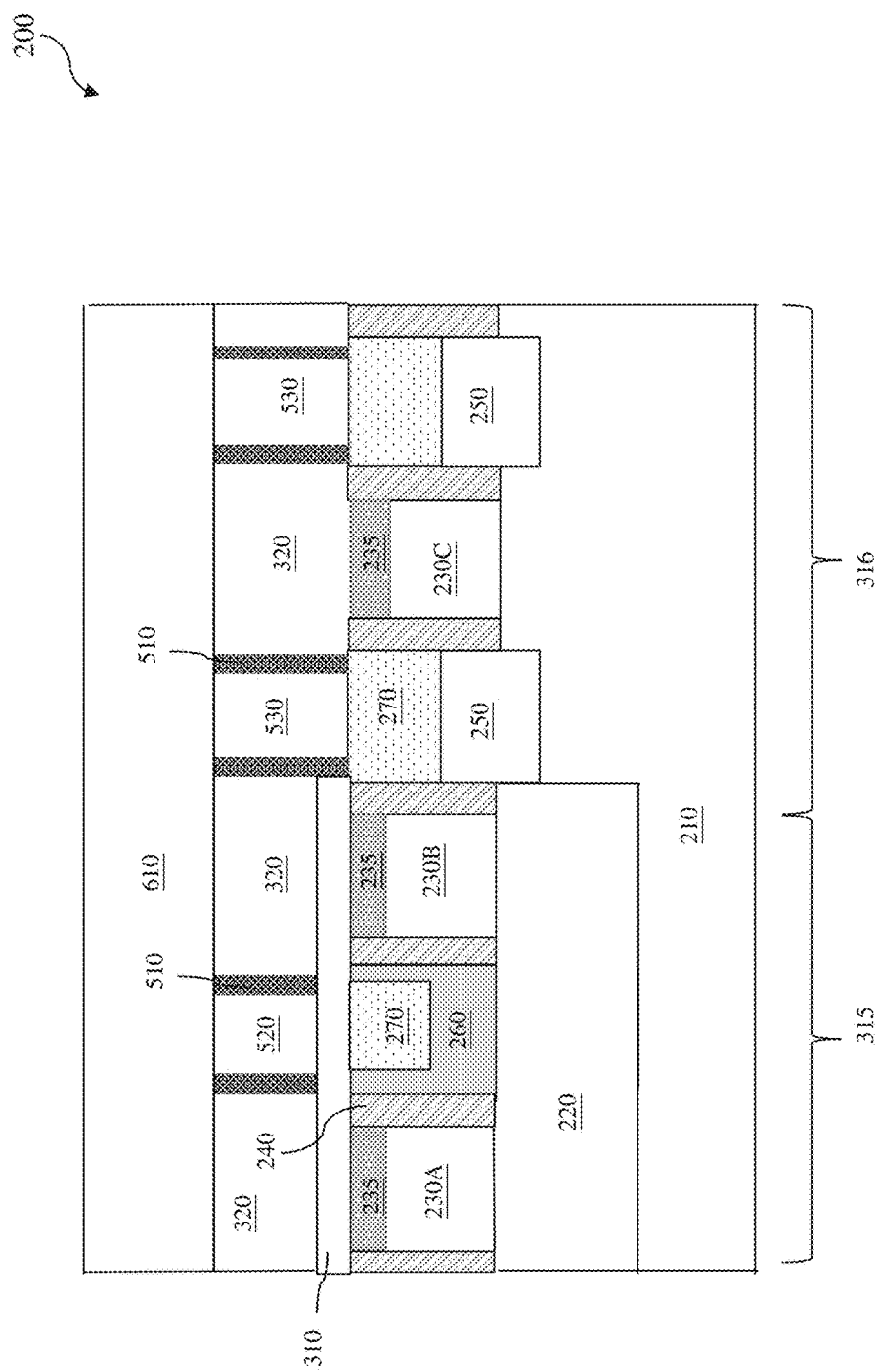

Referring to FIGS. 1 and 8, method 100 proceeds to operation 116 by forming a third dielectric layer 610 over the second dielectric layer 320 and the first and second metal features, 520 and 530. The third dielectric layer 610 is formed similarly in many respects to the first dielectric layer 260 discussed above in association with FIG. 2, including the materials discussed therein.

Figure 9A:
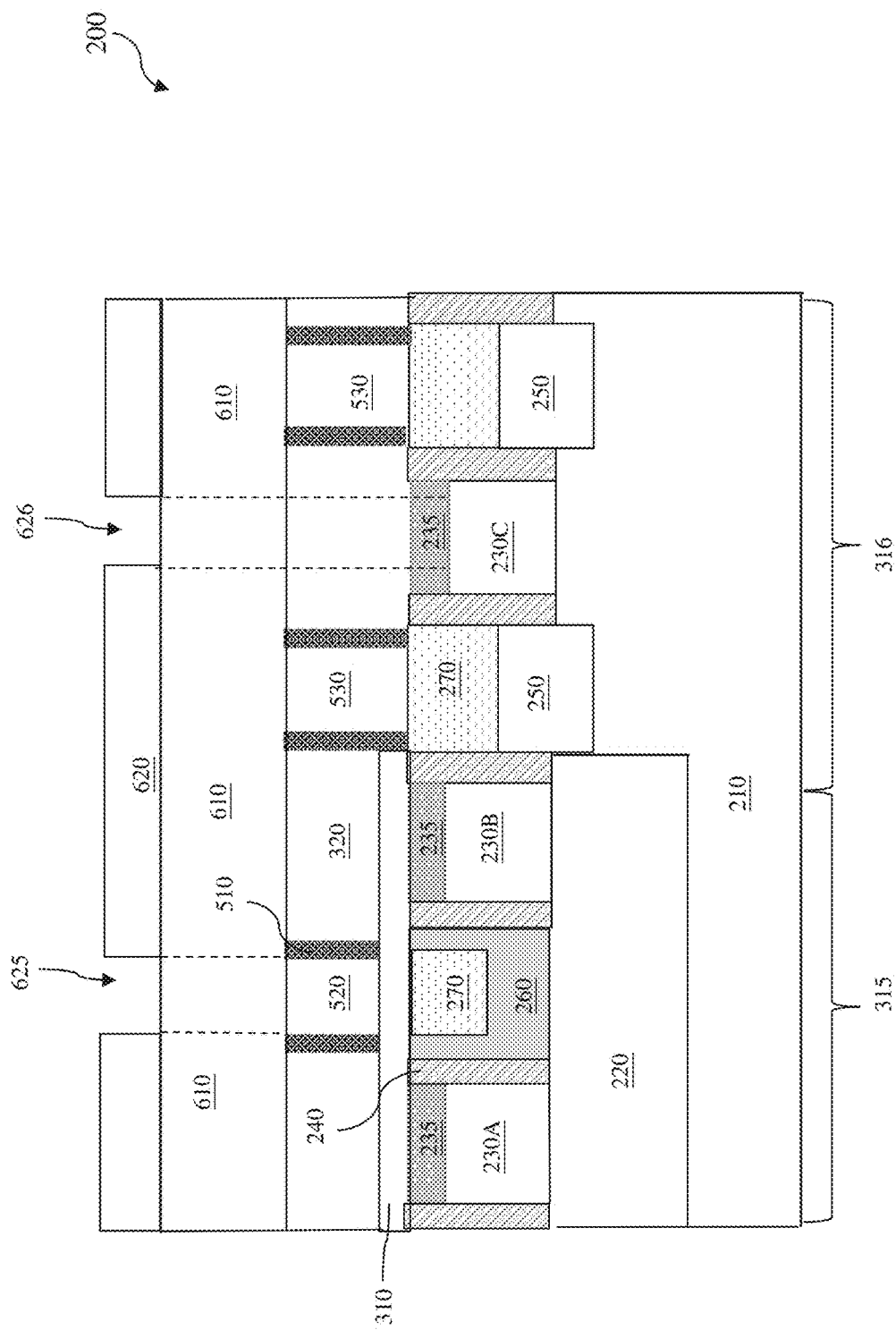

Referring to FIGS. 1 and 9A, method 100 proceeds to operation 118 by forming a second patterned HM 620 over the third dielectric layer 610. In the present embodiment, the second patterned HM 620 has a second opening 625 aligned with and landed on the first metal feature 520 and a third opening 626 aligned with the HK/MG stack 230C. The second patterned HM 620 is formed similarly with many respects to the first patterned HM 410 discussed above in association with FIG. 4, including materials discussed therein.

Figure 9B:
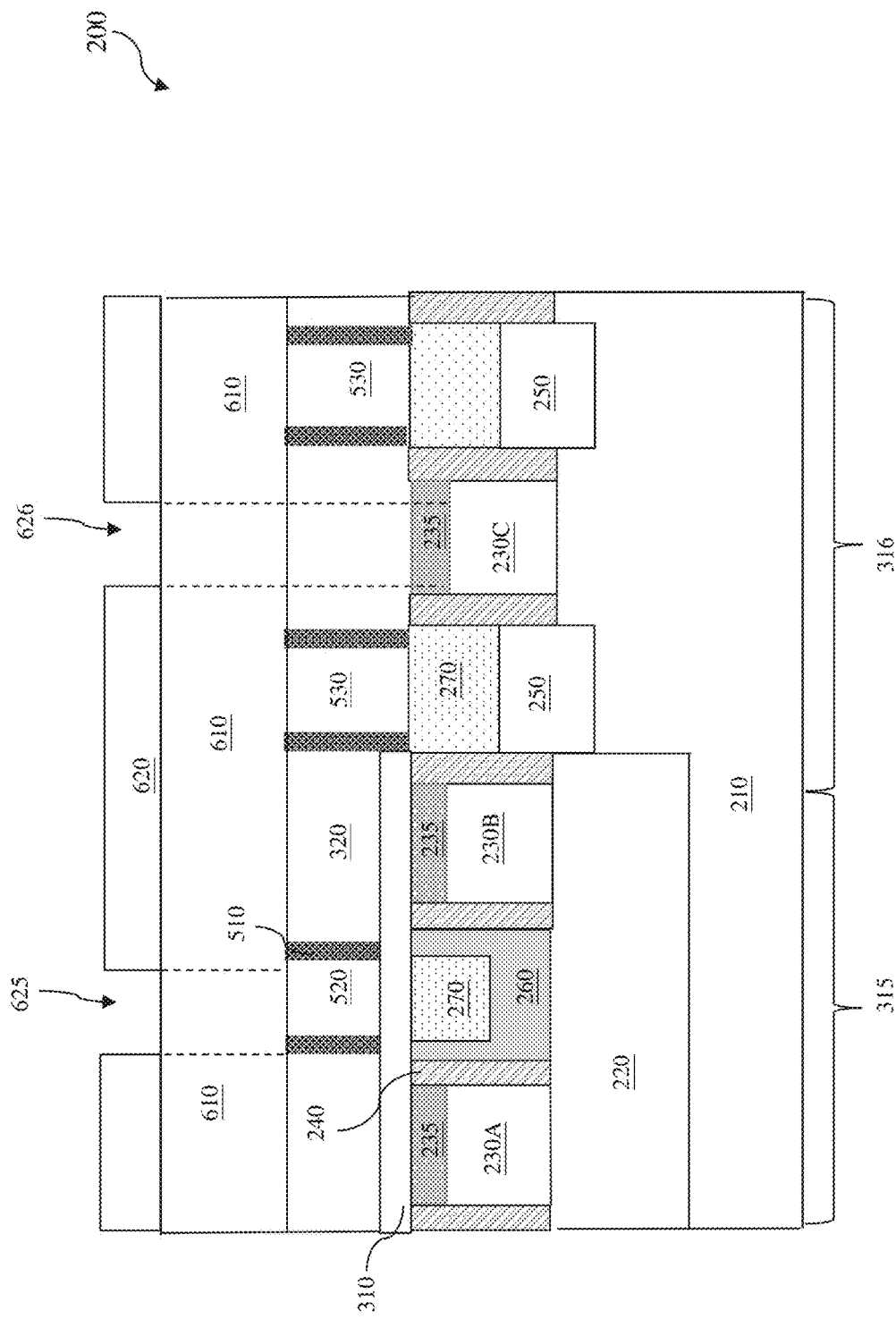

In the present embodiment, with the patterned ESL 310 underneath the first metal feature 520, an off-center alignment of the second opening 625 to the first metal feature 520 (such as it aligns to an outside-edge of one side of the dielectric spacer 510, as shown in FIG. 9B) becomes tolerable. This provides advantages, such as relaxing lithography process resolution constrains and enlarging the process window in the patterning process of forming the second and third openings, 625 and 626, especially when the structure 200 scales down such that widths of the first and second metal features 520 and 530 become substantially small.

Figure 10A:
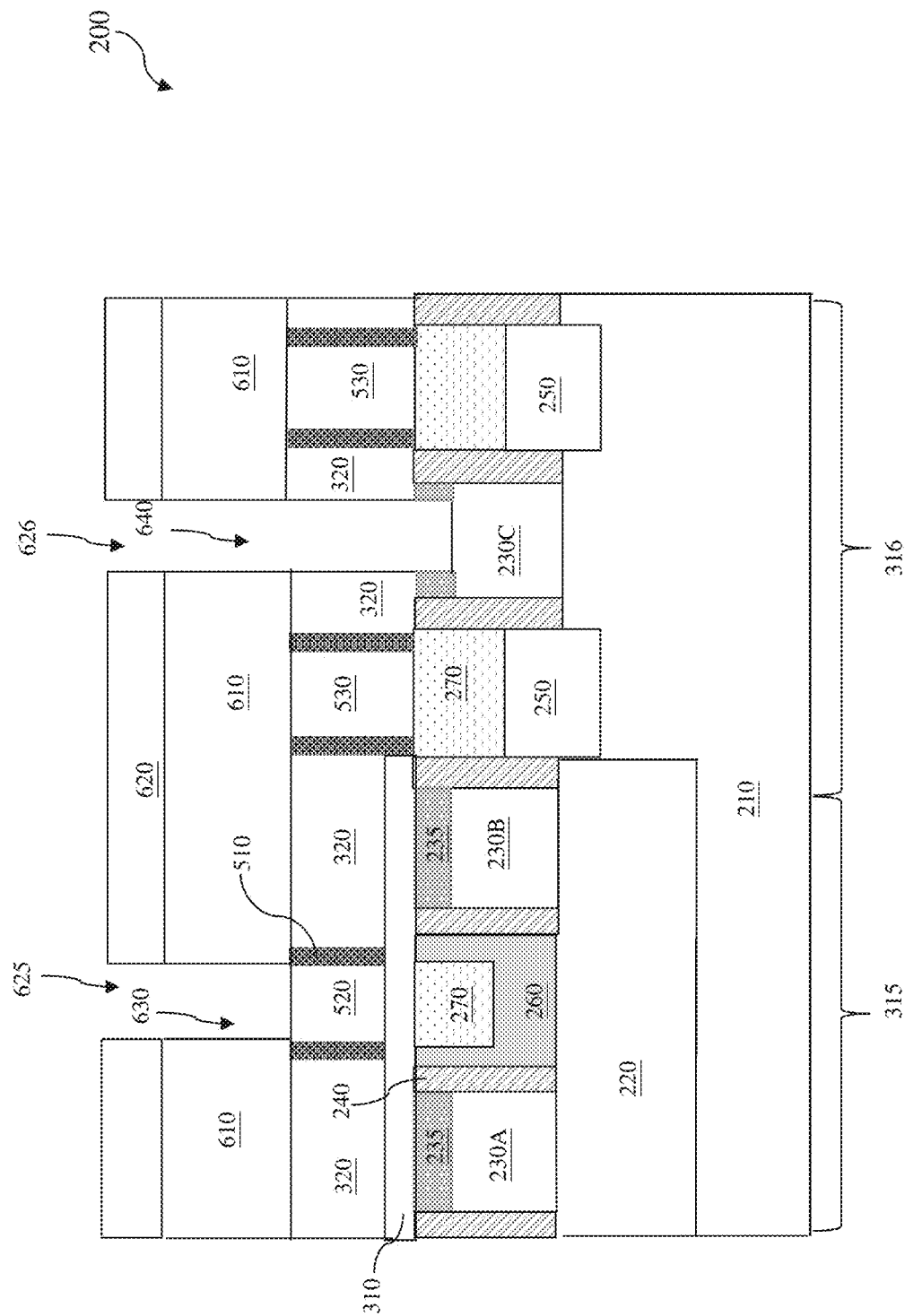

Referring to FIGS. 1 and 10A, method 100 proceeds to operation 120 by etching the third dielectric layer 610 through the second opening 625 to form a third trench 630; and etching the third dielectric layer 610, the second dielectric layer 320 and the GHM 235 through the third opening 626 to form a fourth trench 640. As shown in FIG. 10A, the fourth trench 640 is deeper than the third trench 630. Over-etch is necessary to etch through the dielectric layers (320 and 610) to form the trench the 640. Furthermore, the etch process needs additional etch to break through the gate hard mask 235 and may cause etch through the dielectric features 510 and 240, causing short issue. The patterned ESL 310 is designed to have a composition different from the gate hard mask 235 and further different from the dielectric material layers 510 and 240. Thus, the etch process applied to the gate hard mask 235 will be stopped by the patterned ESL 310 to avoid the above short issues. The etch process may include a selective wet etch, a selective dry etch, and/or a combination thereof. Furthermore, since a metal layer (such as the first metal feature 520) usually withstand well in a dielectric etching process (such as etching the second dielectric layer 320 and the GHM 235), etching process constrains of choosing etchant for an adequate selectivity is relaxed and etching process flexibility is obtained. In an embodiment, the dry etching process includes using fluorine-containing gas (e.g., $CF_4$, $SF_6$, $CH_2F_2$, $CHF_3$, and/or $C_2F_6$).

Figure 10B:
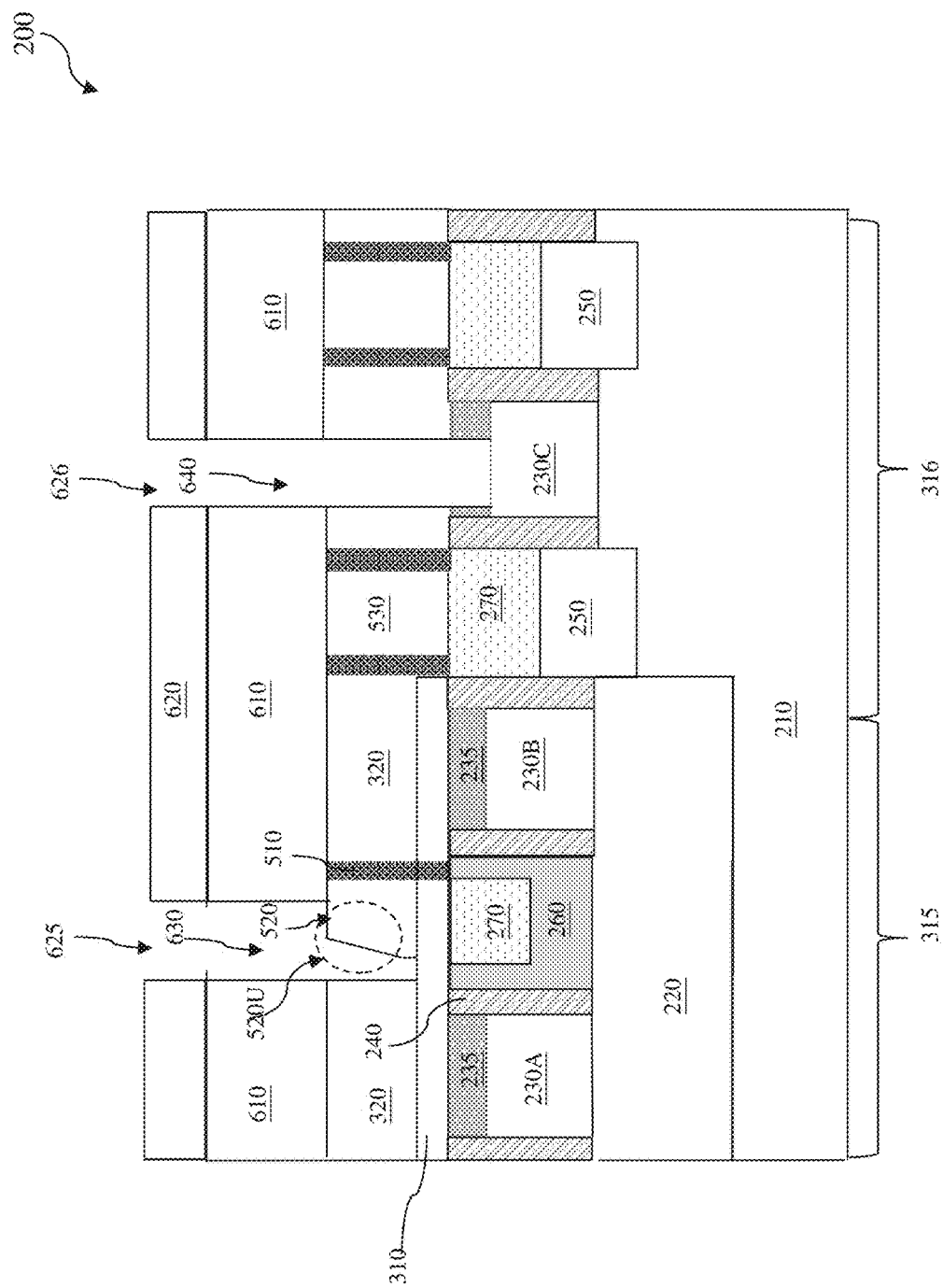

Referring to FIG. 10B, the etch process is chosen to selectively etch the second dielectric layers 320 and 610 without substantially etching the patterned ESL 310. In an embodiment, the third dielectric layer 610 is silicon oxide, the dielectric spacer 510 is silicon nitride and the patterned ESL 310 is silicon carbide. In some embodiments, when the exposed dielectric spacer 510 is etched through, an upper corner 520U of the first metal feature 520 is exposed and is etched away as well, as shown in FIG. 10B. However, even under such circumstances, the patterned ESL 310 protects the gate spacer 240 of the HK/MG stack 230A and the first dielectric layer 260 from being etched.

After forming the third and fourth trenches, 630 and 640, the second pattered HM 620 is removed by a proper etch process. In one example where the second patterned HM 620 is a resist pattern, the second patterned HM 620 is removed thereafter by wet stripping and/or plasma ashing.

Figure 11A:
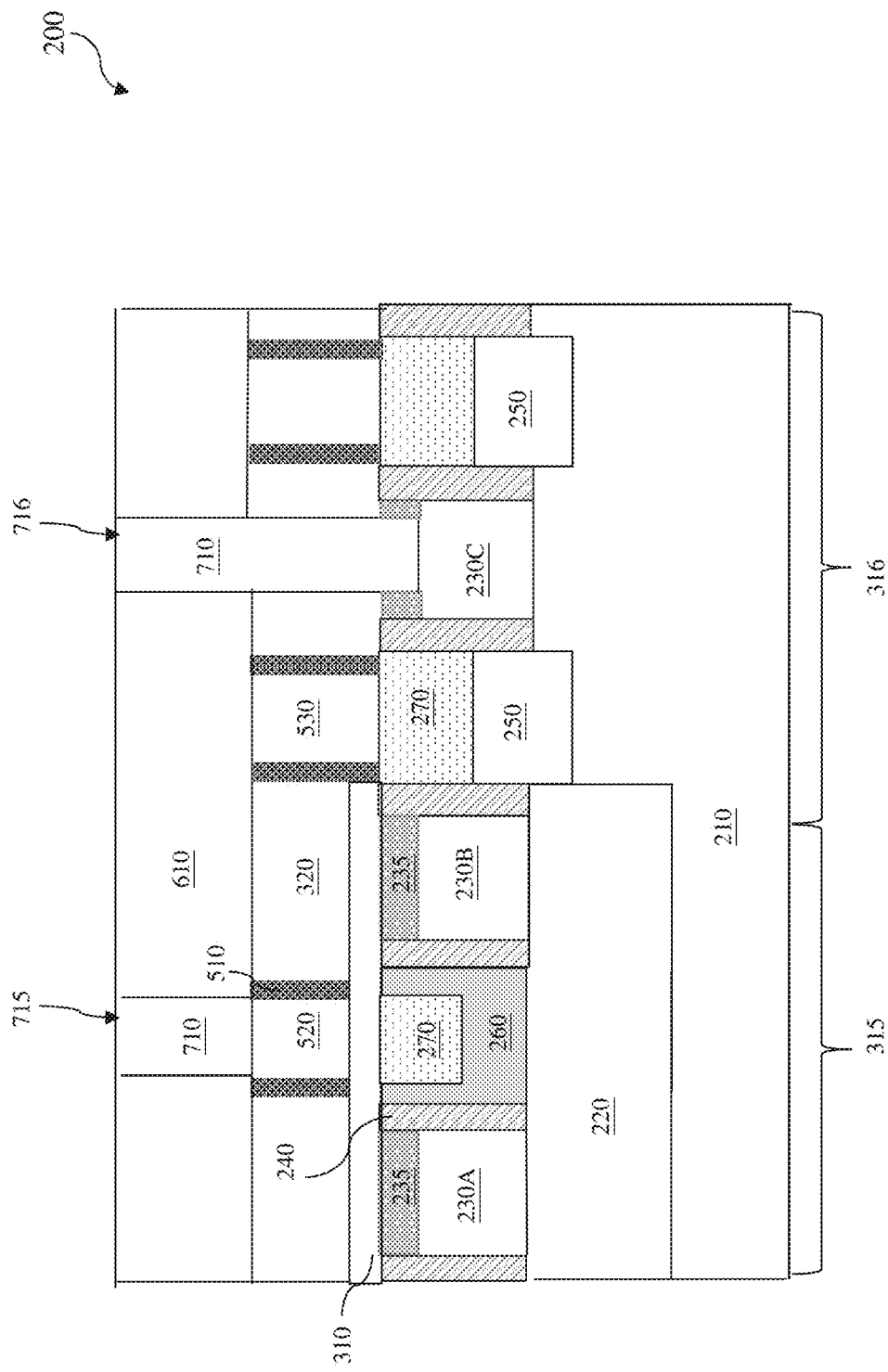
Figure 11B:
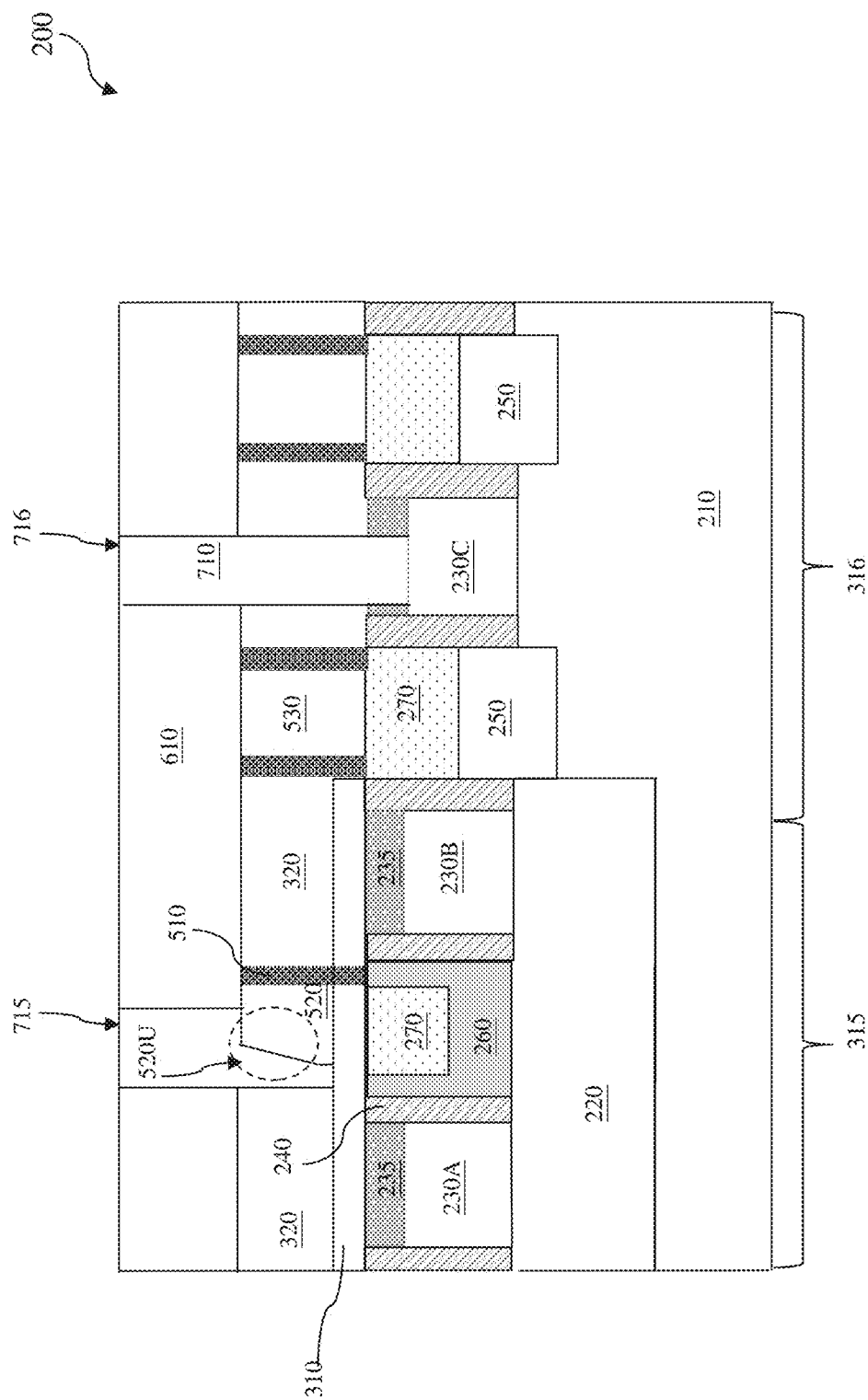

Referring to FIGS. 1, 11A and 11B, method 100 proceeds to operation 122 by forming a second metal layer 710 in the third and fourth trenches, 630 and 640. In that regard, FIG. 11A shows the progression of method 100 from the embodiment depicted in FIG. 10A and FIG. 11B shows the progression of method 100 from the embodiment depicted in FIG. 10B. In some embodiments, the second metal layer 710 may include W, Ti, Ag, Al, TiAlN, TaC, TaCN, TaSiN, Mn, Zr, TiN, TaN, Ru, Mo, Al, WN, Cu, and/or other suitable materials or a combination thereof. The second metal layer 710 may be formed by ALD, PVD, CVD, and/or other suitable process. Additionally, a CMP process is performed to remove excessive second metal layer 710. The CMP process provides a substantially planar top surface for the second metal layer 710 and the third dielectric layer 610. The remaining second metal layer 710 in the third trench 630 and fourth trench 640 forms a third metal feature 715 and a fourth metal feature 716, respectively.

In the third trench 630, the third metal feature 715 physically contacts the first metal feature 520 while in the fourth trench 640, the fourth metal feature 716 physically contacts with the HK/MG stack 230C. In some embodiments, the S/D contact metal 270, the first metal feature 520, the second metal feature 530, the third metal feature 715 and the fourth metal feature 716 form various multilayer interconnection structures to provide vertical and horizontal electrical routing for coupling various devices features (such S/D features 250, HK/MG stack 230C, and/or passive devices) to form a functional circuit.

The semiconductor devices, 200, may include additional features, which may be formed by subsequent processing. Additional steps can be provided before, during, and after the method 100, and some of the steps described can be replaced, eliminated, or moved around for additional embodiments of the method 100.

Based on the above, it can be seen that the present disclosure provides method of forming trenches having different depths during one etching process. The method employs forming a patterned ESL to protect shallow trenches from being etched further during the etching of deeper trenches. The method provides a robust trench formation process with improved process window control and process freedom. Especially, in the operations 120 and 122, via-to-gate metal features (such as 716) to the gate stacks and via-to-S/D metal features (such as 715) to the S/D features can be formed separately or with flexible grouping according to the pattern density and other factors. In one example for illustration, via-to-S/D metal features are formed in a first etch process; a subset of via-to-gate metal features are formed in a second etch process while another subset of via-to-gate metal features are formed with the via-to-S/D metal features in the first etch process for fabrication process, thus providing freedom for fabrication optimization and improvement.

The present disclosure provides various embodiments of a semiconductor structure and a method making the semiconductor structure to provide one or more improvements over existing approaches. In one embodiment, a method for fabricating a semiconductor device includes forming an etch-stop-layer (ESL) that is designed with composition to provide etch selectivity. The ESL is further patterned to cover underlying conductive features, such as a metal gate, from being damaged during the etching process to form the trenches with different depths and even to break the gate hard mask.

In one embodiment, a method includes depositing an etch stop layer on a substrate; patterning the etch stop layer such that a first region of the substrate is covered thereby and a second region of the substrate is exposed within an opening of the etch stop layer; depositing a first dielectric layer on the etch stop layer in the first region and on the substrate in the second region; patterning the first dielectric layer to form a first trench through the first dielectric layer in the first region; forming a metal feature in the first trench; depositing a second dielectric layer over the metal feature in the first region and over the first dielectric layer in the second region; and performing a patterning process to form a second trench through the second dielectric layer in the first region, and to form a third trench through the second and first dielectric layers in the second region.

In yet another embodiment, a method includes forming a first gate structure on a substrate within a first region; depositing a first dielectric layer on the substrate, wherein the first dielectric surrounds the first gate structure; forming a patterned etch-stop-layer (ESL) to cover the first dielectric layer and the first gate structure while leaving a second region of the substrate uncovered by the patterned ESL; depositing a second dielectric layer on the substrate; patterning the second dielectric layer to form a first trench therethrough in the first region; filling a metal feature in the first trench; depositing a third dielectric layer over the second dielectric layer and the metal feature; and performing an etch process, thereby forming a second trench and a third trench wherein the second trench extends through the third dielectric layer with the metal feature being exposed within the second trench and wherein the third trench extends through the third dielectric layer and the second dielectric layer.

In yet another embodiment, a method includes forming, on a substrate, a first gate stack in a first region and a second gate stack in a second region; depositing a first dielectric layer surrounding on the first and second gate stacks; forming a patterned etch-stop-layer (ESL) on the first dielectric layer to cover the first gate stack while leaving the second gate stack uncovered by the patterned ESL; deposing a second dielectric layer over the first and second regions of the substrate; patterning the second dielectric layer to form a first trench through the second dielectric layer in the first region; forming a first metal feature in the first trench; depositing a third dielectric layer over the second dielectric layer and the first metal feature; and performing an etch process that forms both a second trench through the third dielectric layer to expose a portion of the first metal feature in the first region of the substrate and forms a third trench extending through the third dielectric layer and the second dielectric layer to expose the second gate stack in the second region of the substrate.

In yet another embodiment, a method includes forming, on a substrate, a first gate structure in a first region and a second gate structure in a second region; depositing a first dielectric layer over the substrate and surrounding the first and second gate structures; forming a patterned etch-stop-layer (ESL) on the first dielectric layer to cover the first gate structure while leaving the second gate structure uncovered by the patterned ESL; deposing a second dielectric layer over the first and second regions of the substrate; patterning the second dielectric layer to form a first trench through the second dielectric layer in the first region; filling a metal feature in the first trench; depositing a third dielectric layer over the second dielectric layer and the metal feature; and performing an etch process, thereby forming a second trench through the third dielectric layer to expose a portion of the metal feature in the first region of the substrate and forming a third trench extending through the third dielectric layer and the second dielectric layer to expose the second gate structure in the second region of the substrate.

In yet another embodiment, a metal gate is provided over an isolation structure, and sounded by a first nitride layer (e.g., SiNx). A hard mask layer is positioned above the first nitride layer and a first interlayer dielectric layer (ILD) is formed above the hard mask. The hard mask can be such things as SiC, SiOx, or SiNx. An opening is formed in the first ILD and side spacers are formed in the opening. The side spacers can be a second nitride layer (e.g., SiN). A plug is formed, such as a tungsten plug with CMP, in the opening. Afterwards, a second ILD is formed and patterned over the first ILD, and via etch process is performed which may remove some of the side spacers in the opening. The hard mask serves to stop the via etch process from further etching into the first nitride layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing an etch stop layer on a substrate;
   patterning the etch stop layer such that a first region of the substrate is covered by the etch stop layer and a second region of the substrate is exposed within an opening of the etch stop layer;
   depositing a first dielectric layer on the etch stop layer in the first region and on the substrate in the second region;
   patterning the first dielectric layer to form a first trench through the first dielectric layer in the first region such that the etch stop layer is exposed within the first trench;
   forming a metal feature in the first trench;
   depositing a second dielectric layer over the metal feature in the first region and over the first dielectric layer in the second region; and
   performing a patterning process to form a second trench through the second dielectric layer in the first region such that the metal feature is exposed within the second trench, and to form a third trench through the second and first dielectric layers in the second region.

2. The method of claim 1, further comprising forming a gate structure in the second region of the substrate, wherein depositing the first dielectric layer over the second region includes depositing the first dielectric layer over the gate structure.

3. The method of claim 2, wherein the forming of the third trench includes forming the third trench such that the gate structure is exposed in the third trench.

4. The method of claim 2, further comprising:
   forming source/drain features in the second region of the substrate, wherein the source/drain features are separated by the gate structure; and
   forming a contact metal feature on the source/drain feature.

5. The method of claim 4, wherein forming the first trench through the first dielectric layer includes forming a fourth trench through the first dielectric layer that extends to the contact metal feature.

6. The method of claim 2, wherein the patterning the etch stop layer includes patterning the etch stop layer to cover the gate structure.

7. The method of claim 2, further comprising filling a second metal feature in the second trench to be connected to the metal feature.

8. The method of claim 7, further comprising filling a third metal feature in the third trench to be connected to the gate structure.

9. The method of claim 1, further comprising forming a spacer layer on sidewalls of the first trench.

10. The method of claim 1, wherein an isolation feature formed in the substrate extends within the first region and an active region extends within the second region.

11. A method comprising:
    forming a first gate structure on a substrate within a first region;
    depositing a first dielectric layer on the substrate, wherein the first dielectric layer surrounds the first gate structure;
    forming a patterned etch-stop-layer (ESL) to cover the first dielectric layer and the first gate structure while leaving a second region of the substrate uncovered by the patterned ESL;
    depositing a second dielectric layer on the substrate;
    patterning the second dielectric layer to form a first trench therethrough in the first region;
    filling a metal feature in the first trench;
    depositing a third dielectric layer over the second dielectric layer and the metal feature; and
    performing an etch process to form a second trench and a third trench, wherein the second trench extends through the third dielectric layer with the metal feature being exposed within the second trench and wherein the third trench extends through the third dielectric layer and the second dielectric layer.

12. The method of claim 11, wherein the patterned ESL protects the first dielectric layer and the first gate structure in the first region from being etched during the etch process.

13. The method of claim 11, further comprising:
    forming a second gate structure on the substrate in the second region, wherein forming the third trench includes forming the third trench extending through the third and second dielectric layers to reach the second gate structure.

14. The method of claim 13, further comprising:
forming source/drain features in the second region and interposed by the second gate structure; and
forming a contact metal feature over the source/drain feature.

15. The method of claim 14, wherein patterning the second dielectric layer to form a first trench includes patterning the second dielectric layer to form a fourth trench extending through the second dielectric layer and reaching to the contact metal feature.

16. The method of claim 11, further comprising depositing a metal layer, thereby forming a second metal feature in the second trench and directly on the metal feature and forming a third metal feature in the third trench and directly on the second gate structure.

17. The method of claim 11, wherein performing the etch process includes performing the etch process to form the second trench in the third dielectric layer such that the patterned ESL is exposed within the second trench.

18. A method comprising:
forming, on a substrate, a first gate stack in a first region and a second gate stack in a second region;
depositing a first dielectric layer surrounding the first and second gate stacks;
forming a patterned etch-stop-layer (ESL) on the first dielectric layer to cover the first gate stack while leaving the second gate stack uncovered by the patterned ESL;
depositing a second dielectric layer over the first and second regions of the substrate;
patterning the second dielectric layer to form a first trench through the second dielectric layer in the first region;
forming a first metal feature in the first trench;
depositing a third dielectric layer over the second dielectric layer and the first metal feature; and
performing an etch process that forms a second trench through the third dielectric layer to expose a portion of the first metal feature in the first region of the substrate and forms a third trench extending through the third dielectric layer and the second dielectric layer to expose the second gate stack in the second region of the substrate.

19. The method of claim 18, wherein:
the forming of the first and second gate stacks includes forming a gate hard mask over gate materials, etching the gate materials using the gate hard mask as an etch mask, and forming gate spacers on side walls of the first and second gate stacks; and
the patterned ESL has a composition different from the second and third dielectric layers, the gate hard mask and the gate spacers to protect the first gate stack in the first region from being etched during the etch process.

20. The method of claim 18, further comprising performing another etch process that forms a fourth trench extending through the third dielectric layer and the second dielectric layer to expose a third gate stack in a third region of the substrate.

* * * * *